(12) United States Patent
Kim et al.

(10) Patent No.: US 11,469,157 B2
(45) Date of Patent: Oct. 11, 2022

(54) SEMICONDUCTOR DEVICES HAVING THROUGH ELECTRODES AND METHODS FOR FABRICATING THE SAME

(71) Applicant: Samsung Electronics Co., Ltd., Suwon-si (KR)

(72) Inventors: Dong-Wan Kim, Hwaseong-si (KR); Jung-Hoon Han, Hwaseong-si (KR); Dong-Sik Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/152,012

(22) Filed: Jan. 19, 2021

(65) Prior Publication Data
US 2021/0143086 A1 May 13, 2021

Related U.S. Application Data

(63) Continuation of application No. 16/426,612, filed on May 30, 2019, now Pat. No. 10,950,523, which is a (Continued)

(30) Foreign Application Priority Data

Mar. 3, 2016 (KR) .......................... 10-2016-0025814

(51) Int. Cl.
*H01L 23/48* (2006.01)
*H01L 23/538* (2006.01)
*H01L 21/768* (2006.01)

(52) U.S. Cl.
CPC ...... *H01L 23/481* (2013.01); *H01L 21/76838* (2013.01); *H01L 21/76885* (2013.01); *H01L 21/76898* (2013.01); *H01L 23/5384* (2013.01); *H01L 21/7684* (2013.01); *H01L 21/76834* (2013.01); *H01L 2224/11* (2013.01); *H01L 2224/16145* (2013.01); *H01L 2224/16225* (2013.01); *H01L 2924/15311* (2013.01); *H01L 2924/181* (2013.01)

(58) Field of Classification Search
None
See application file for complete search history.

(56) References Cited

U.S. PATENT DOCUMENTS 7,633,165 B2   12/2009   Hsu et al.
8,076,234 B1   12/2011   Park et al.
(Continued)

FOREIGN PATENT DOCUMENTS

KR   100609996 B1   8/2006

*Primary Examiner* — Long Pham
(74) *Attorney, Agent, or Firm* — Harness, Dickey & Pierce, P.L.C.

(57) ABSTRACT

The semiconductor device includes a substrate including an integrated circuit and a contact that are electrically connected to each other, an insulation layer covering the substrate and including metal lines, and a through electrode electrically connected to the integrated circuit. The insulation layer includes an interlayer dielectric layer on the substrate and an intermetal dielectric layer on the interlayer dielectric layer. The metal lines include a first metal line in the interlayer dielectric layer and electrically connected to the contact, and a plurality of second metal lines in the intermetal dielectric layer and electrically connected to the first metal line and the through electrode. The through electrode includes a top surface higher than a top surface of the contact.

27 Claims, 10 Drawing Sheets

Related U.S. Application Data continuation of application No. 15/443,259, filed on Feb. 27, 2017, now Pat. No. 10,340,204.

(56) References Cited

U.S. PATENT DOCUMENTS

| | | |
|---|---|---|
| 8,390,120 B2 | 3/2013 | Moon et al. |
| 8,896,127 B2 | 11/2014 | Chang et al. |
| 9,076,849 B2 | 7/2015 | An et al. |
| 9,559,041 B2 | 1/2017 | Ishihara |
| 2007/0036944 A1 | 2/2007 | Auerbach et al. |
| 2014/0061940 A1 | 3/2014 | Kitao et al. |
| 2015/0102497 A1 | 4/2015 | Park et al. |
| 2015/0108605 A1 | 4/2015 | Park et al. |
| 2015/0311116 A1 | 10/2015 | Matsuura |
| 2020/0066679 A1 | 2/2020 | Bohr et al. |
| 2020/0176380 A1 | 6/2020 | Chen et al. |
| 2020/0312714 A1 | 10/2020 | Kirby et al. |

SEMICONDUCTOR DEVICES HAVING THROUGH ELECTRODES AND METHODS FOR FABRICATING THE SAME

CROSS-REFERENCE TO RELATED APPLICATIONS

This application is a continuation of U.S. application Ser. No. 16/426,612, filed on May 30, 2019, which is a continuation application of U.S. Non-provisional patent application Ser. No. 15/443,259, filed on Feb. 27, 2017, which claims priority under 35 U.S.C. § 119 of Korean Patent Application 10-2016-0025814 filed on Mar. 3, 2016, the entire contents of each of which are hereby incorporated by reference.

BACKGROUND

Example embodiments of the inventive concepts relate to semiconductors and/or methods for fabricating the same. For example, at least some example embodiments relate to semiconductor devices having through electrodes and/or methods for fabricating the same.

Through electrodes have been suggested to, for example, electrically connect semiconductor devices to other semiconductor devices or to integrated circuit boards. The through electrodes can be used in a three-dimensional configuration, and/or provide a relatively faster speed compared to conventional solder balls. Thus, it may be desirable to form through-electrodes having electrically reliable characteristics.

SUMMARY

Example embodiments of the present inventive concepts provide semiconductor devices having through electrodes with improved electrical characteristics and/or method for fabricating the same.

According to example embodiments of the present inventive concepts, a semiconductor device may include a substrate including an integrated circuit and an electrical contact electrically connected to the integrated circuit; an insulation layer covering the substrate and includes a plurality of metal lines electrically connected to the integrated circuit; and a through electrode that penetrates the substrate and is electrically connected to the integrated circuit. The insulation layer may include an interlayer dielectric layer on the substrate; and an intermetal dielectric layer on the interlayer dielectric layer. The plurality of metal lines may include: a first metal line that is provided in the interlayer dielectric layer and electrically connected to the electrical contact; and a plurality of second metal lines that are provided in the intermetal dielectric layer and electrically connected to the first metal line and the through electrode. The through electrode may include a top surface higher in relation to the substrate than a top surface of the electrical contact.

According to example embodiments of the present inventive concepts, a method for fabricating a semiconductor device may include: forming an interlayer dielectric layer on a substrate including an integrated circuit and an electrical contact electrically connected to the integrated circuit; forming a through electrode partially penetrating the substrate; forming, in the interlayer dielectric layer, a first metal line electrically connected to the electrical contact; sequentially forming a capping layer and an intermetal dielectric layer on the interlayer dielectric layer; and forming in the intermetal dielectric layer a plurality of second metal lines electrically connected to the first metal line and the through electrode.

According to example embodiments of the present inventive concepts, a semiconductor device may include a semiconductor substrate including a top surface on which an integrated circuit and a plurality of electrical contacts electrically connected to the integrated circuit and a bottom surface opposite the top surface; an interlayer dielectric layer that is provided on the top surface of the substrate and covers the electrical contacts; a plurality of first metal lines that are provided in the interlayer dielectric layer and electrically connected to the electrical contacts; an intermetal dielectric layer that is provided on the interlayer dielectric layer and covers the first metal lines; a capping layer between the interlayer dielectric layer and the intermetal dielectric layer; a through electrode that penetrates the semiconductor substrate and the interlayer dielectric layer; and a plurality of second metal lines that are provided in the intermetal dielectric layer and connected to a top surface of the through electrode. The top surface of the through electrode may be higher than top surfaces of the electrical contacts. The capping layer may cover a portion of the top surface of the through electrode. The portion of the top surface of the through electrode may be present between the second metal lines.

According to example embodiments of the present inventive concepts, a semiconductor device may include an insulation layer having an upper surface and a lower surface covering an upper surface of a substrate having an integrated circuit (IC) and a contact thereon, the insulation layer including at least first metal lines and an interlayer dielectric layer adjacent thereto such that a first one of the first metal lines is electrically isolated from a second one of the first metal lines; and a through electrode extending from the upper surface of the insulation layer to at least a lower surface of the substrate such that the through electrode is electrically connected to the IC via the contact.

BRIEF DESCRIPTION OF THE DRAWINGS

The accompanying drawings are included to provide a further understanding of the example embodiments, and are incorporated in and constitute a part of this specification. The drawings illustrate example embodiments and, together with the description, serve to explain principles of the example embodiments. In the drawings.

DETAILED DESCRIPTION

Hereinafter, it will be described about example embodiments in conjunction with the accompanying drawings.

FIGS. 1A to 1L are cross-sectional views illustrating a method for fabricating a semiconductor device according to example embodiments of the present inventive concepts. FIG. 1M is an enlarged cross-sectional view illustrating a portion of FIG. 1L.

Figure 1A:
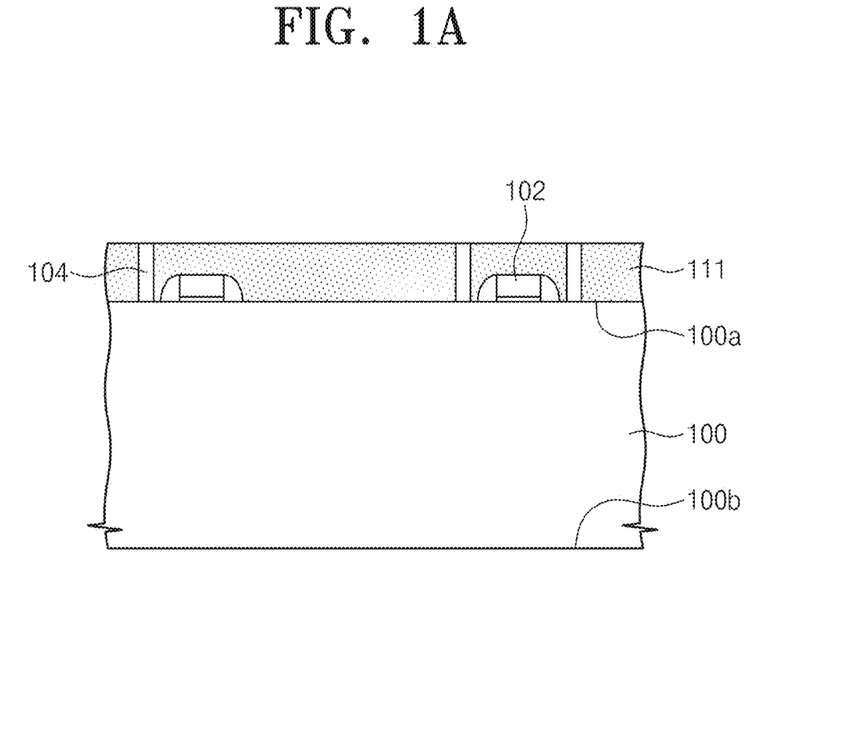
FIGS. 1A to 1L are cross-sectional views illustrating a method for fabricating a semiconductor device according to example embodiments of the present inventive concepts.

Referring to FIG. 1A, a substrate 100 may be provided to include a top surface 100a and a bottom surface 100b opposite the top surface 100a. The substrate 100 may include a semiconductor substrate such as a silicon wafer. A first insulation layer 111 including an integrated circuit 102 therein may be formed on the top surface 100a of the substrate 100. The integrated circuit 102 may include a memory circuit, a logic circuit, or a combination thereof. The first insulation layer 111 may include a silicon oxide layer, a silicon nitride layer, or a TEOS (tetraethyl orthosilicate) oxide layer formed by, for example, a chemical vapor deposition. One or more electrical contacts 104 may be formed to vertically penetrate the first insulation layer 111 by patterning the first insulation layer 111 and depositing a conductive material. The electrical contacts 104 may be in contact with the substrate 100 and electrically connected to the substrate 100 and/or the integrated circuit 102. The electrical contacts 104 may include a metal such as copper, tungsten, aluminum, or any combination thereof.

Figure 1B:
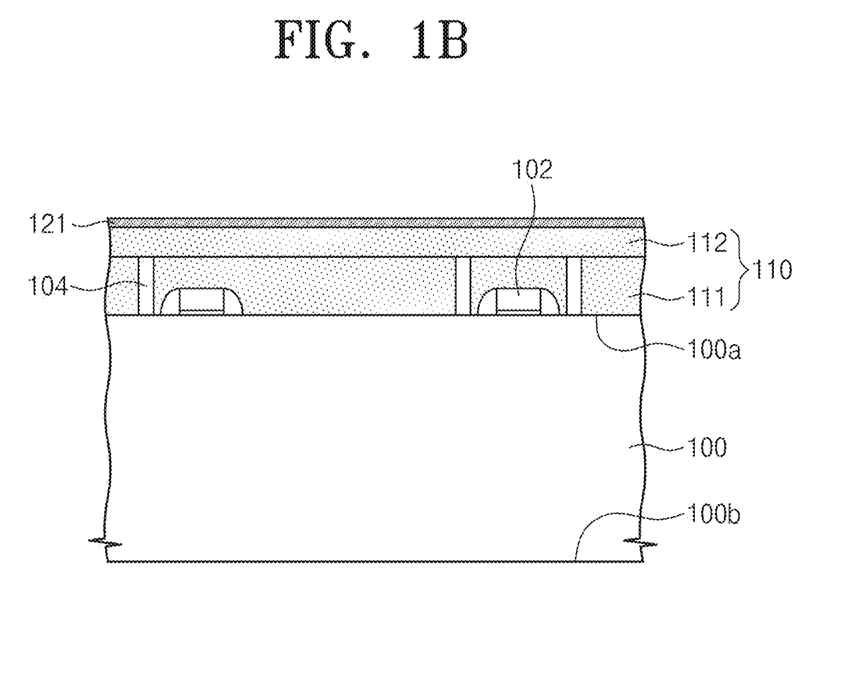

Referring to FIG. 1B, a second insulation layer 112 may be formed on the first insulation layer 111 and then a polish stop layer 121 may be formed on the second insulation layer 112. Substantially identical or similar to the formation of the first insulation layer 111, the second insulation layer 112 may include a TEOS (tetraethyl orthosilicate) oxide layer formed by, for example, a chemical vapor deposition. The first and second insulation layers 111 and 112 may constitute an interlayer dielectric layer 110 that encapsulates the integrated circuit 102 and the electrical contacts 104. The polish stop layer 121 may include a material different from that of the second insulation layer 112. For example, the polish stop layer 121 may include a silicon nitride layer formed by, for example, a chemical vapor deposition.

Figure 1C:
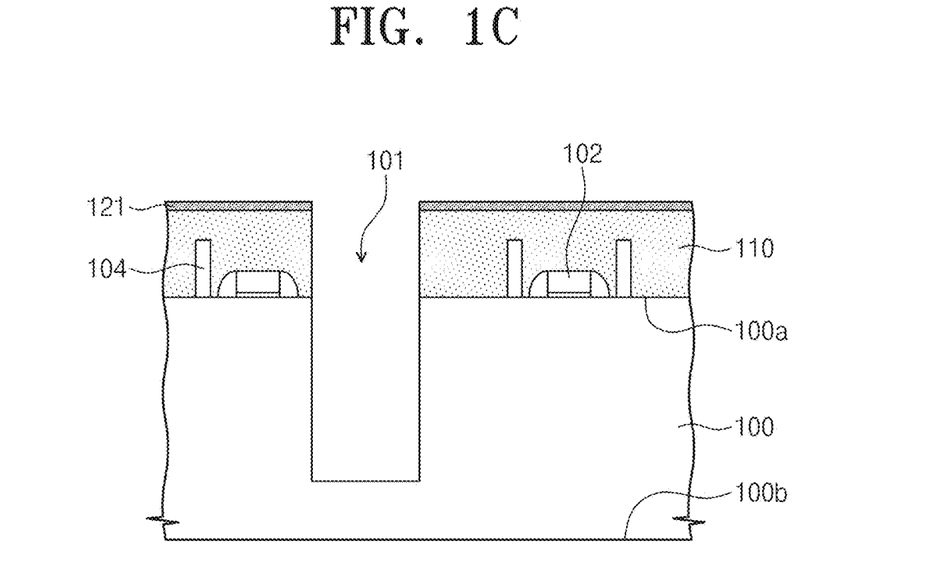

Referring to FIG. 1C, a photolithography process and an etch process may be performed to form a via hole 101 that vertically penetrates the polish stop layer 121, the interlayer dielectric layer 110, and the substrate 100. The via hole 101 may completely penetrate the polish stop layer 121 and the interlayer dielectric layer 110. The via hole 101 may partially penetrate the substrate 100 and may not reach the bottom surface 100b of the substrate 100.

Figure 1D:
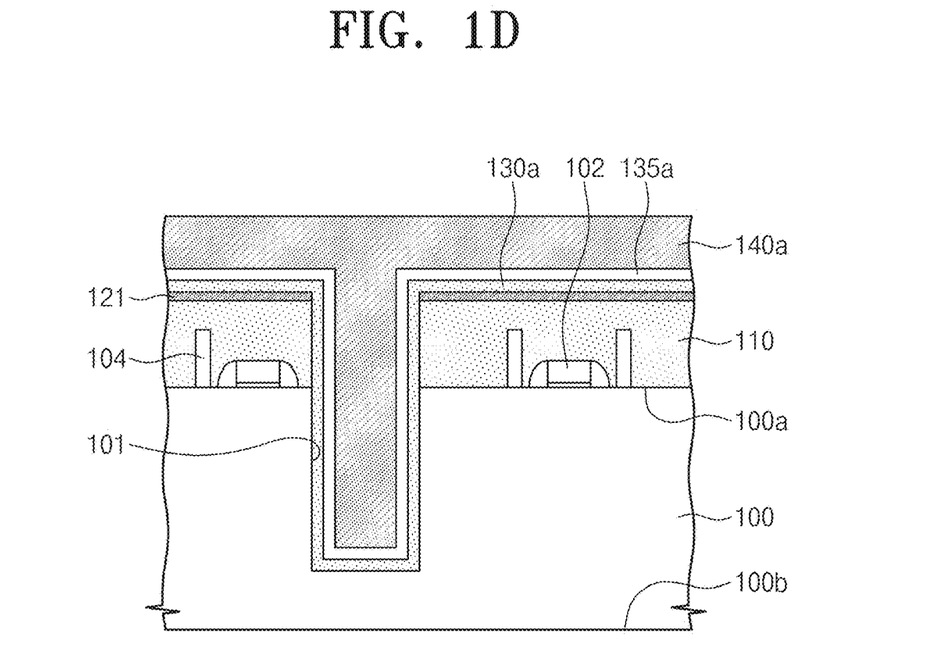

Referring to FIG. 1D, an insulation layer 130a may be formed to cover an inner wall of the via hole 101 and a top surface of the polish stop layer 121. And then, a conductive layer 140a may be formed on the substrate 100 such that the via hole 101 may be filled with the conductive layer 140a. The insulation layer 130a may be formed by depositing HARP (high aspect ratio process) oxide using an SACVD (sub-atmospheric chemical vapor deposition). The conductive layer 140a may be formed by depositing or plating polysilicon, copper, tungsten, aluminum, etc.

When the conductive layer 140a is formed of copper or copper-containing conductive material, a metal layer 135a may be further formed on the insulation layer 130a to prevent copper from being diffused. The metal layer 135a may be formed to have a shape that conforms to the insulation layer 130a by depositing a metal including titanium (Ti), titanium nitride (TiN), chromium (Cr), tantalum (Ta), tantalum nitride (TaN), nickel (Ni), tungsten (W), tungsten nitride (WN), or any combination thereof.

Figure 1E:
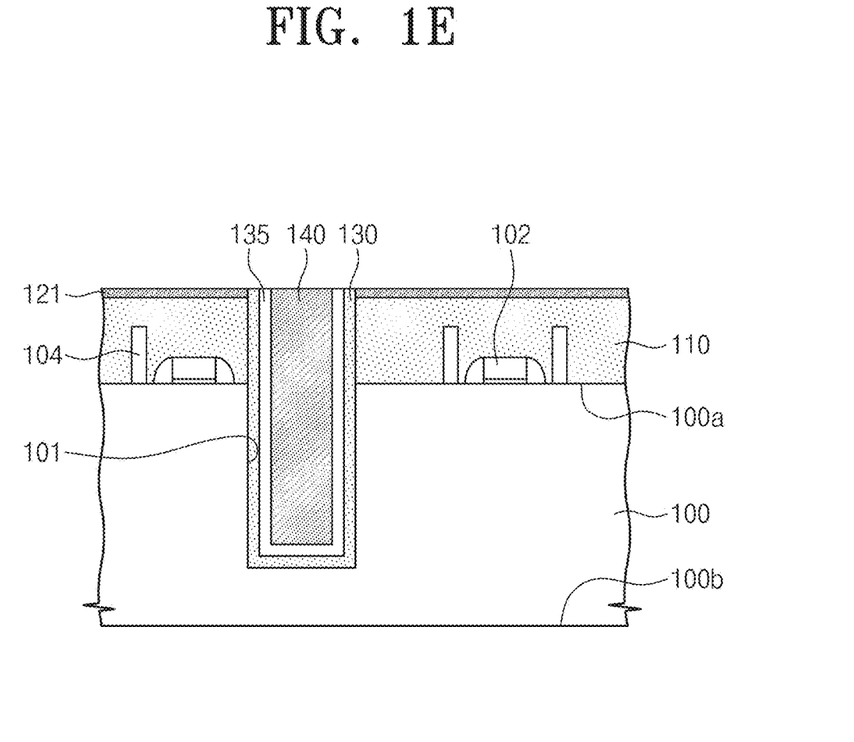

Referring to FIG. 1E, the conductive layer 140a may be planarized using, for example, a chemical mechanical polishing (CMP) process. The CMP process may be performed until the polish stop layer 121 is exposed. The insulation layer 130a and the metal layer 135a may be polished together with the conductive layer 140a during the planarization process. The planarization process may change the conductive layer 140a into a pillar-shaped through electrode 140 that fills the via hole 101, and the insulation layer 130a into a cup-shaped via insulation layer 130 that surrounds side and bottom surfaces of the through electrode 140. When the metal layer 135a is further formed, the planarization process may also change the metal layer 135a into a barrier layer 135 that reduces (or, alternatively, prevents) a constituent (e.g., copper) of the through electrode 140 from being diffused into the substrate 100 and/or the integrated circuit 102.

Figure 1F:
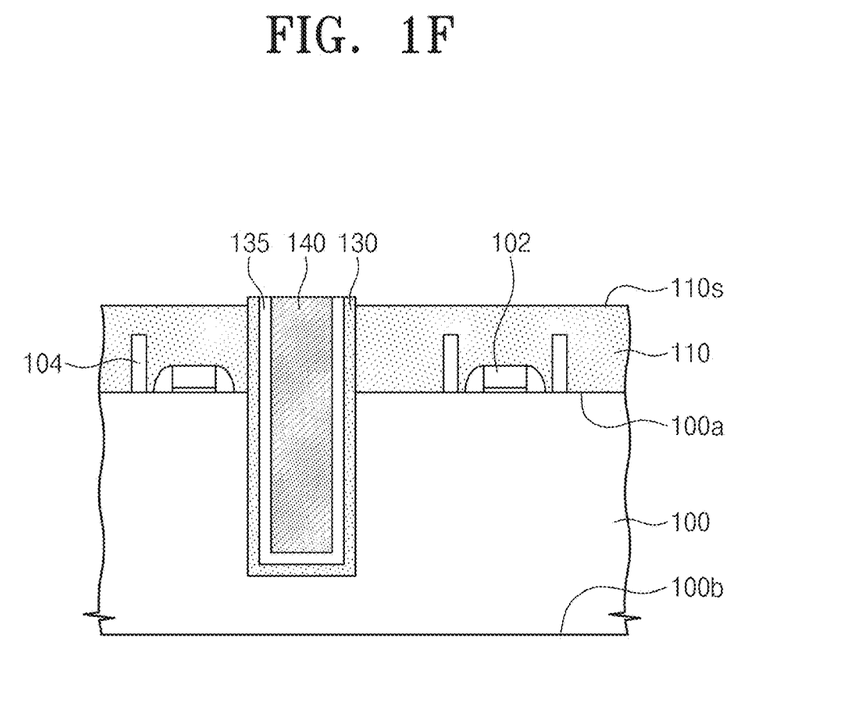

Referring to FIG. 1F, the polish stop layer 121 may be selectively removed. For example, the polish stop layer 121 may be removed from the substrate 100 by an etch process using an etchant capable of selectively removing the polish stop layer 121. The removal of the polish stop layer 121 may expose the through electrode 140 and a top surface 110s of the interlayer dielectric layer 110. The through electrode 140 may protrude from the top surface 110s of the interlayer dielectric layer 110.

Figure 1G:
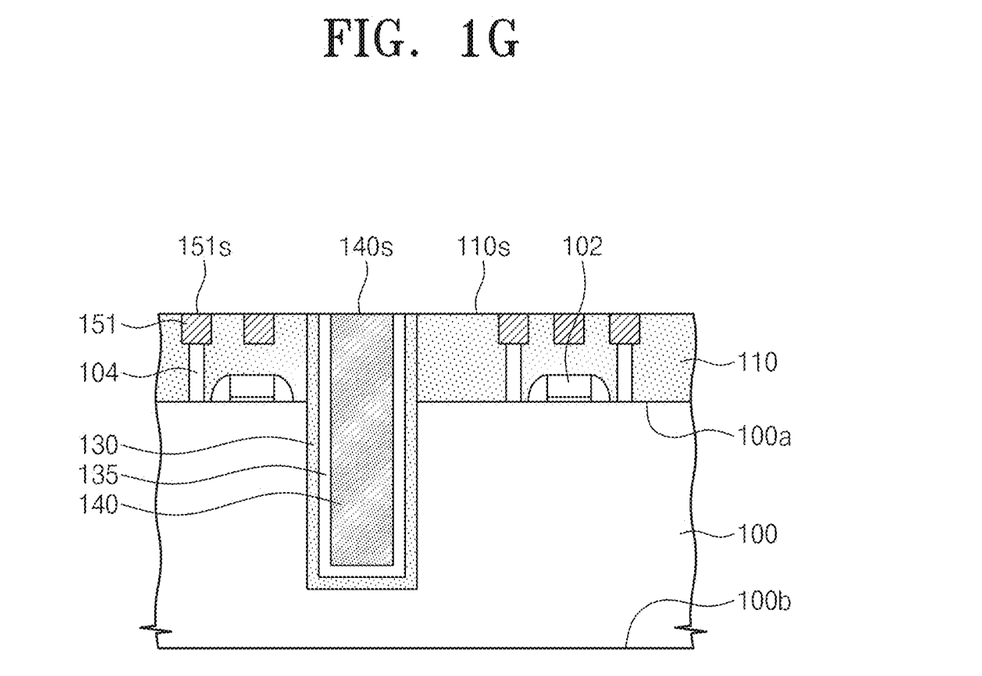

Referring to FIG. 1G, a plurality of first metal lines 151 may be formed to be electrically connected to the electrical contacts 104. The first metal lines 151 may include a metal such as copper, tungsten, aluminum, or any combination thereof. In an embodiment, the first metal lines 151 may include copper formed by, for example, a damascene process. A protruding portion of the through electrode 140 from the top surface 110s of the interlayer dielectric layer 110 may be removed when the first metal lines 151 are formed. Accordingly, the through electrode 140 may have a top surface 140s coplanar with the top surface 110s of the interlayer dielectric layer 110 and/or top surfaces 151s of the first metal lines 151.

Figure 1H:
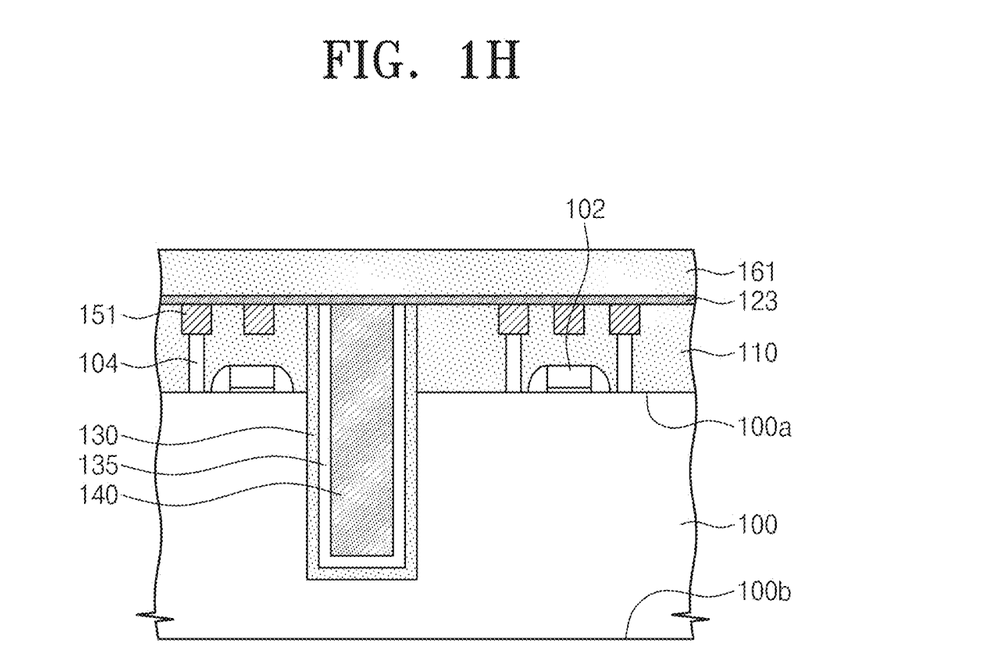

Referring to FIG. 1H, a first capping layer 123 may be formed to cover the interlayer dielectric layer 110 and then a first intermetal dielectric layer 161 may be formed on the first capping layer 123. The first capping layer 123 may cover the through electrode 140 and the first metal lines 151. For example, substantially identical or similar to the formation of the polish stop layer 121, the first capping layer 123 may include a silicon nitride layer formed by, for example, a chemical vapor deposition. Alternatively, the first capping layer 123 may include a low-k insulating material (e.g., SiCN) capable of preventing metal constituents of the first metal lines 151. Substantially identical or similar to the formation of the interlayer dielectric layer 110, the first intermetal dielectric layer 161 may include a TEOS (tetraethyl orthosilicate) oxide layer formed by, for example, a chemical vapor deposition.

Figure 1I:
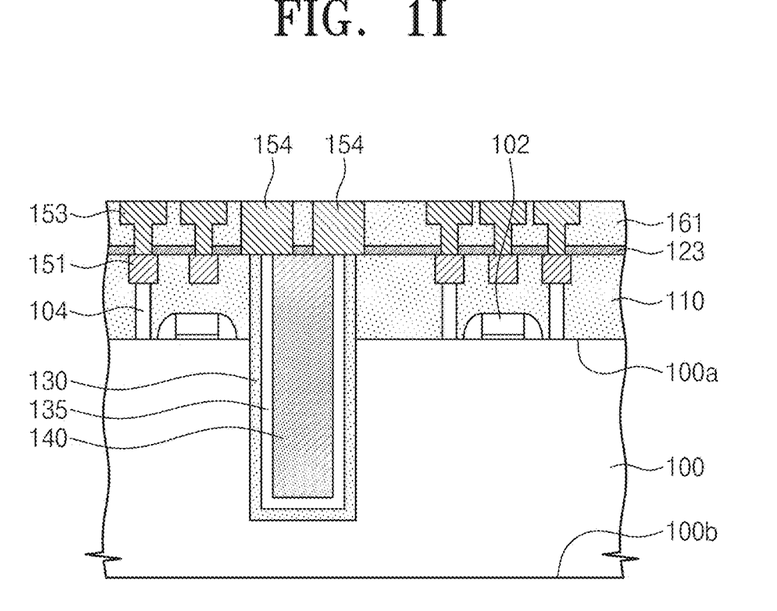

Referring to FIG. 1I, a plurality of second metal lines 153 and 154 may be formed to be connected to the first metal lines 151 and the through electrode 140. The second metal lines 153 and 154 may penetrate the first intermetal dielectric layer 161 and the first capping layer 123 to be in contact with the first metal lines 151 and the through electrode 140. Substantially identical or similar to the formation of the first metal lines 151, the second metal lines 153 and 154 may include copper formed by, for example, a damascene process.

The second metal lines 153 and 154 may include a one or more (or, alternatively, a plurality of) first interconnection lines 153 electrically connected to the first metal lines 151 and a plurality of second interconnection lines 154 electrically connected to the through electrode 140. In an example embodiment, at least two second interconnection lines 154 may be electrically connected to the through electrode 140. For example, the first interconnection lines 153 may be formed by a dual damascene process and the second interconnection lines 154 may be formed by a single damascene process. Alternatively, one of the single and dual damascene processes may be performed to form the second metal lines 153 and 154 whose shapes are identical or similar to each other.

Figure 1J:
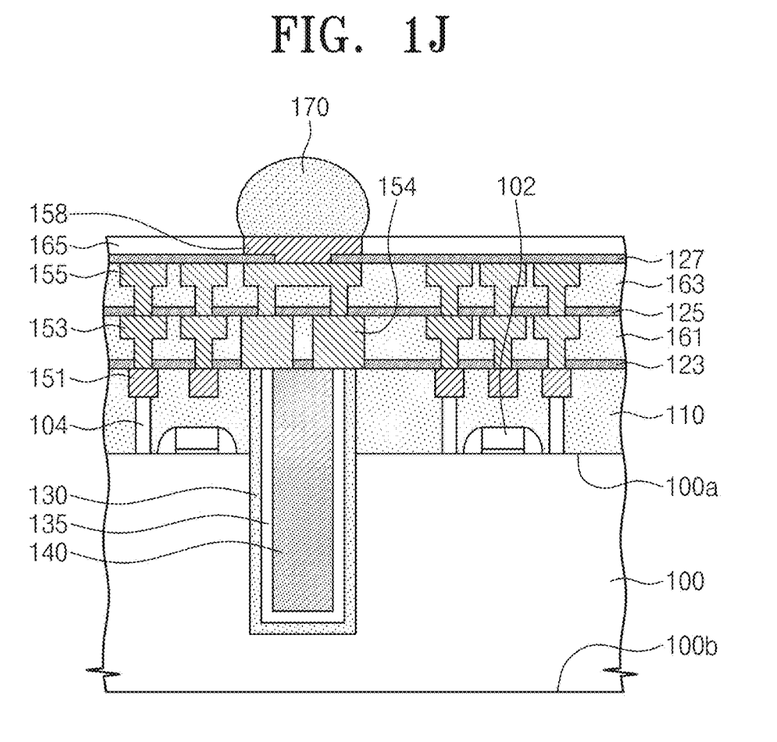

Referring to FIG. 1J, a second capping layer 125, a second intermetal dielectric layer 163, a plurality of third metal lines 155, and a third capping layer 127 may be sequentially formed on the first intermetal dielectric layer 161. At least one of the second and third capping layers 125 and 127 may include a material substantially the same as that of the first capping layer 123. Substantially identical or similar to the formation of the second metal lines 153 and 154, the third metal lines 155 may include a metal such as copper, tungsten, aluminum, or any combination thereof. The third metal lines 155 may be electrically connected to the second metal lines 153 and 154. For example, the third metal lines 155 may include copper formed by, for example, a dual damascene process.

An upper protection layer 165 may be formed on the third capping layer 127, and an upper line 158 may be formed to be electrically connected to at least one of the third metal lines 155.

An upper terminal 170, such as a solder ball, may be formed on the upper protection layer 165 to be electrically connected to the upper line 158. The upper line 158 may include, for example, copper. The upper terminal 170 may include, for example, a lead-free solder. The upper protection layer 165 may be formed by, for example, depositing an insulating material such as silicon oxide, silicon nitride, or polymer.

Figure 1K:
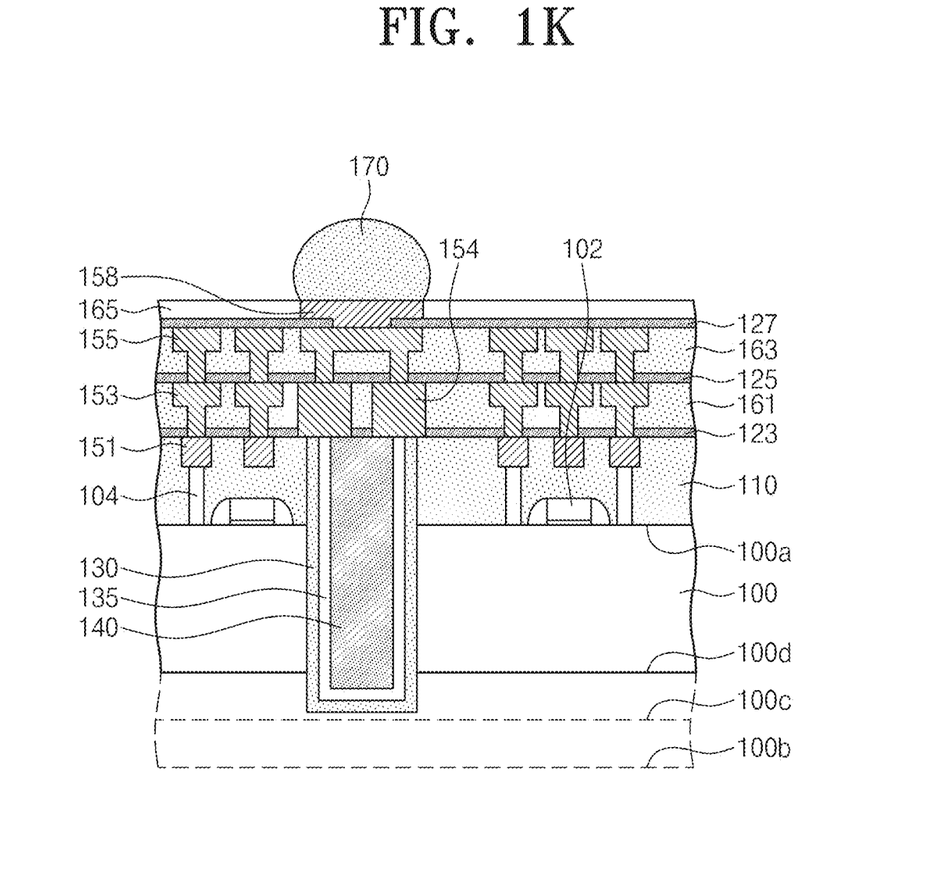

Referring to FIG. 1K, the substrate 100 may be recessed to protrude the through electrode 140. For example, the bottom surface 100b of the substrate 100 may be recessed by at least one of an etching process, a chemical mechanical polishing process, a grinding process, or any combination thereof which uses an etchant or slurry capable of selectively removing a constituent (e.g., silicon) of the substrate 100. The recess process may be performed until a third bottom surface 100d is revealed. The third bottom surface 100d may be closer to the top surface 100a than the bottom surface 100b, and the through electrode 140 may protrude from the third bottom surface 100d.

For example, the bottom surface 100b of the substrate 100 may be, for example, chemically mechanically polished to reveal a second bottom surface 100c through which the through electrode 140 is not exposed, and the second surface 100c may be then be, for example, dry-etched to reveal the third bottom surface 100d through which the through electrode 140 is exposed. The top surface 100a may be hereinafter referred to as an active surface, and the third bottom surface 100d may be hereinafter referred to as an inactive surface.

Figure 1L:
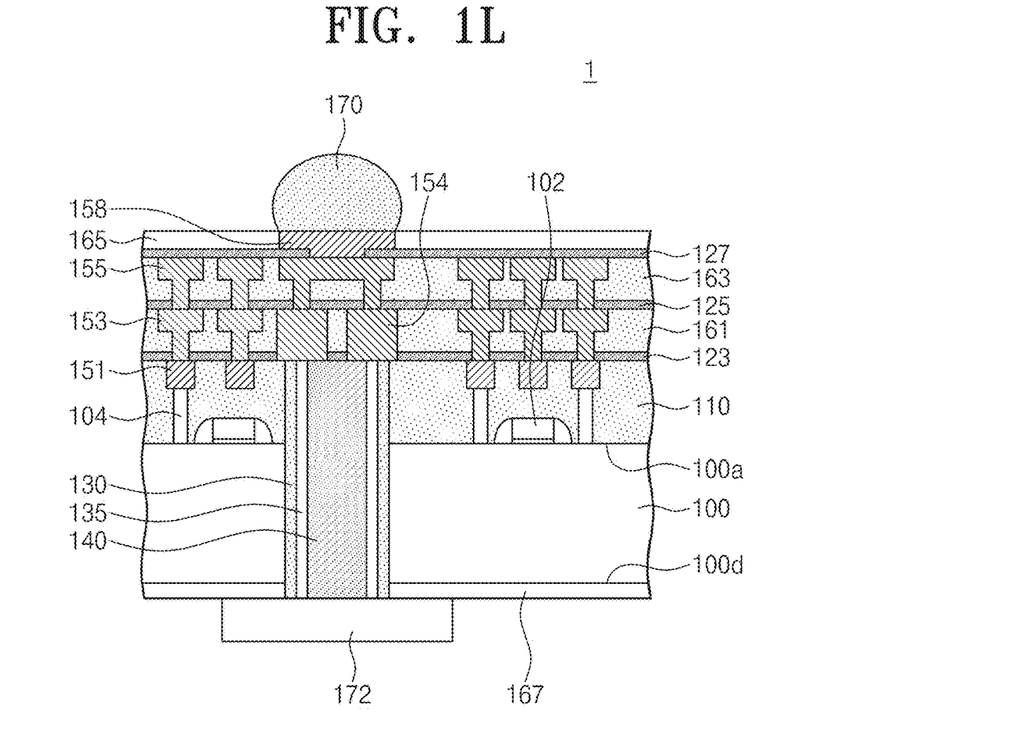
Figure 1M:
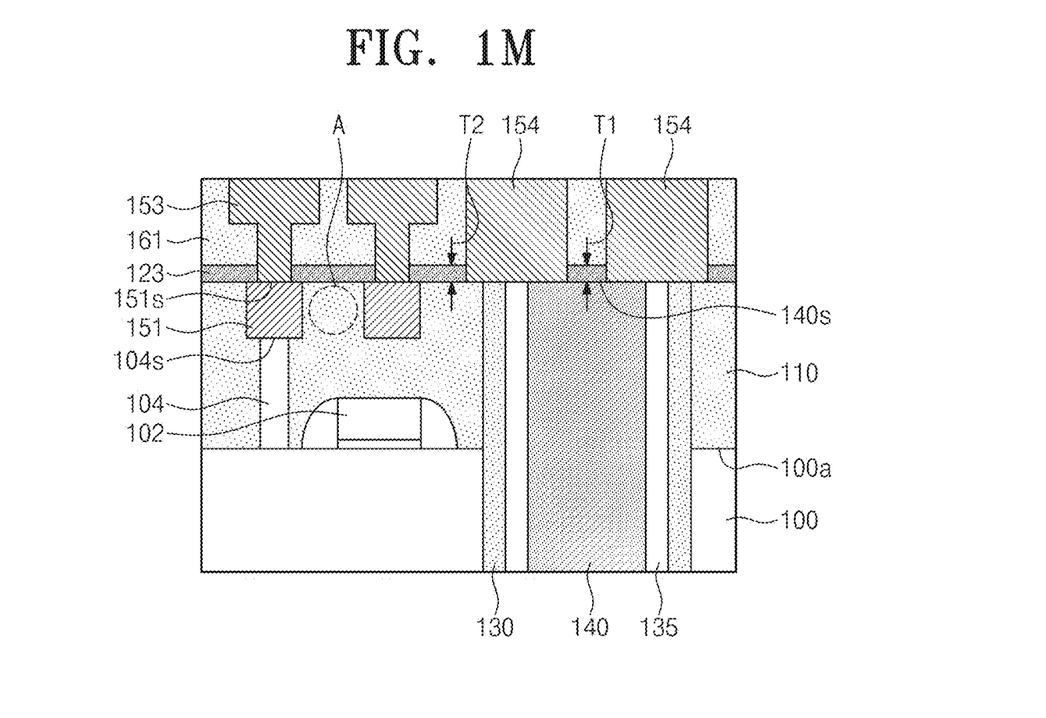
FIG. 1M is an enlarged cross-sectional view illustrating a portion of FIG. 1L.

Referring to FIG. 1L, a lower protection layer 167 may be formed to cover the inactive surface 100d of the substrate 100, and a lower terminal 172 may be formed on the lower protection layer 167 to be electrically connected to the through electrode 140. The lower terminal 172 may have a pad shape or a solder ball shape.

The processing described above with reference to FIGS. 1A to 1L may fabricate a semiconductor device 1 including the through electrode 140.

Referring to FIG. 1M, the interlayer dielectric layer 110 may fill spaces between adjacent ones of the first metal lines 151. For example, as discussed with reference to FIGS. 1A and 1B, the interlayer dielectric layer 110 may include the first and second insulation layers 111 and 112 that are formed of the same material. Thereafter, as discussed in FIG. 1G, a damascene process may be performed to form the first metal lines 151 in the interlayer dielectric layer 110 to be electrically connected to the electrical contacts 104. Accordingly, a region A between adjacent first metal lines 151 may include the same material (e.g., TEOS oxide). In other words, the region A may have no interface, horizontally extending along the active surface 100a of the substrate 100, which will be formed between different materials in contact with each other. Therefore, there may be a reduced probability of electrical failure in the semiconductor device 1, such as, an electrical short occurred when constituents (e.g., copper) of the first metal lines 151 migrate along an interface in the space A between the adjacent first metal lines 151.

In example embodiments, after the formation of the through electrode 140 that penetrates the interlayer dielectric layer 110, the first metal lines 151 may be formed in the interlayer dielectric layer 110 to be electrically connected to the electrical contacts 104 using, for example, a damascene process. Thus, the first metal lines 151 may have the top surfaces 151s coplanar with the top surface 140s of the through electrode 140. At least one of the first metal lines 151 may have a bottom surface in contact with a top surface 104s of the electrical contact 104. The top surface 140s of the through electrode 140 may be higher than the top surface 104s of the electrical contact 104.

According to an example embodiment, the formation of the first capping layer 123 may be followed by the formation of the second metal lines 153 and 154. The plurality of second metal lines 153, 154 may include at least two second interconnection lines 154 on the through electrode 140. Accordingly, the first capping layer 123 may remain between adjacent second interconnection lines 154 on the through electrode 140.

The first capping layer 123 may have a substantially uniform thickness. For example, the first capping layer 123 may have a first thickness T1 at between the second interconnection lines 154 on the through electrode 140 and a second thickness T2, substantially the same as the first thickness T1, at other portions thereof. As the first capping layer 123 has the uniform thickness, the top surface 140s of the through electrode may be flat.

Figure 2A:
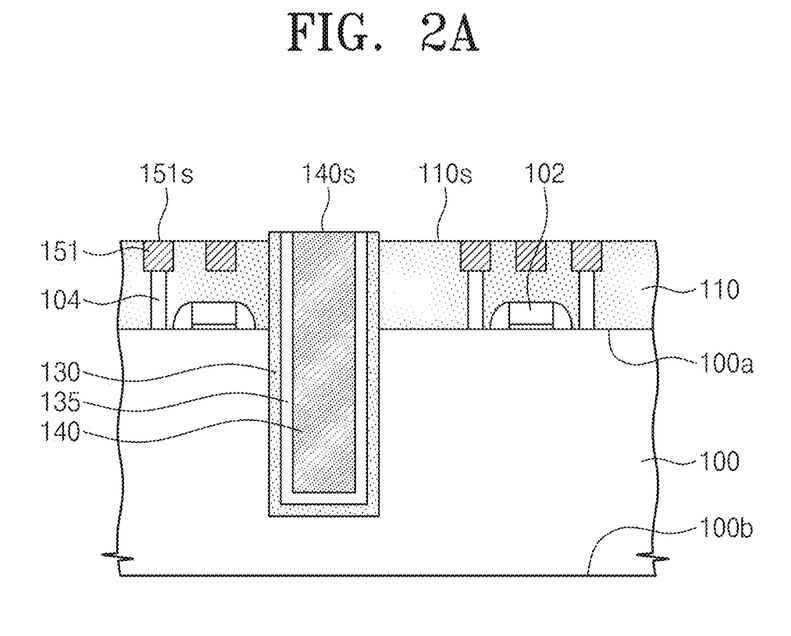
FIGS. 2A to 2C are cross-sectional views illustrating a method for fabricating a semiconductor device according to example embodiments of the present inventive concepts.
Figure 2B:
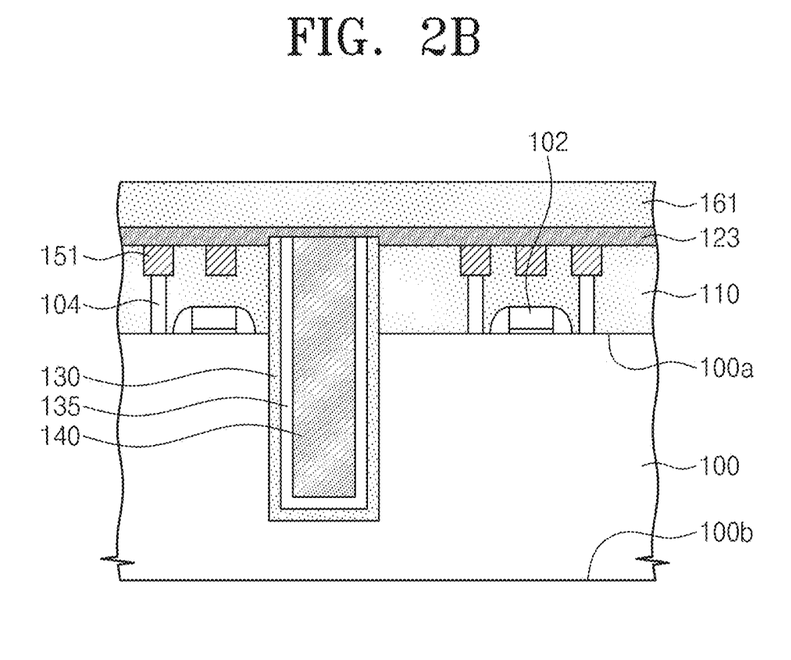
Figure 2C:
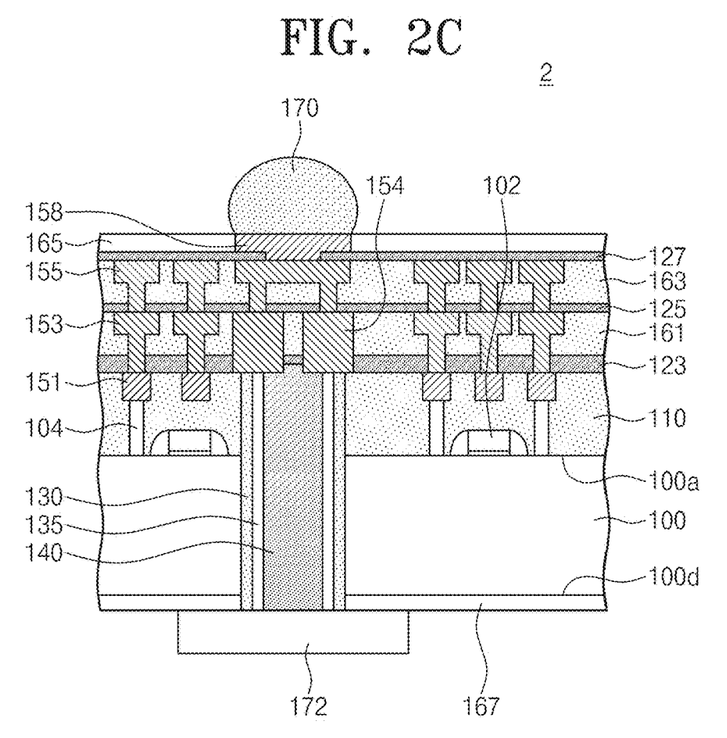
Figure 2D:
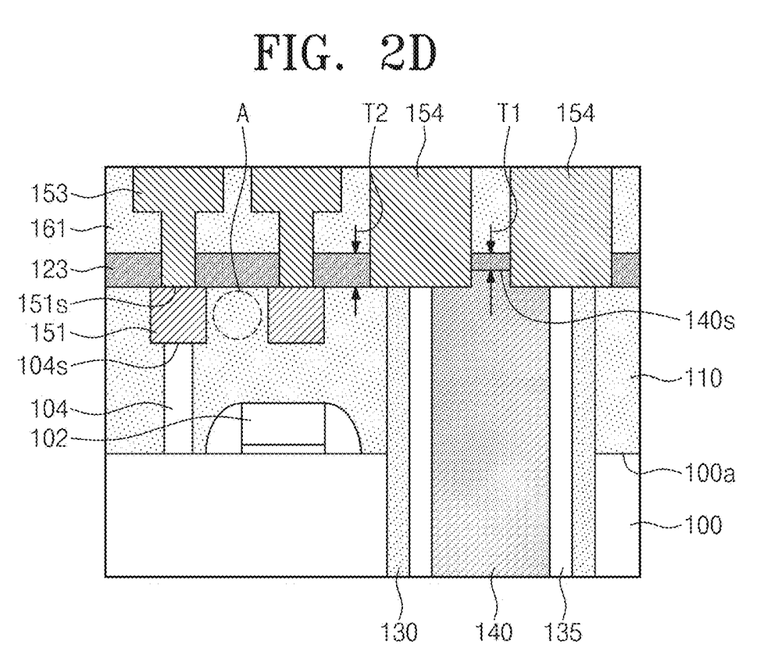
FIG. 2D is an enlarged cross-sectional view illustrating a portion of FIG. 2C.

FIGS. 2A to 2C are cross-sectional views illustrating a method for fabricating a semiconductor device according to example embodiments of the present inventive concepts. FIG. 2D is an enlarged cross-sectional view illustrating a portion of FIG. 2C.

In the example embodiments that follows, the description of features that are the same as those the foregoing example embodiments will be omitted or roughly mentioned and different features will be discussed in detail.

Referring to FIG. 2A, using processes identical or similar to those discussed with reference to FIGS. 1A to 1G, the through electrode 140 may be formed and then the first metal lines 151 may be formed to be electrically connected to the electrical contacts 104.

For example, when a damascene process is performed to form the first metal lines 151, it may be possible to leave the protruding portion of the through electrode 140 remaining on the top surface 110s of the interlayer dielectric layer 110. Accordingly, the through electrode 140 may have the top surface 140s higher than the top surface 110s of the interlayer dielectric layer 110 and/or the top surfaces 151s of the first metal lines 151. In other example embodiments, the protruding portion of the through electrode 140 from the top surface 110s of the interlayer dielectric layer 110 is removed while the top surface 140s of the through electrode 140 remains higher than the top surface 110s of the interlayer dielectric layer 110 and/or the top surfaces 151s of the first metal lines 151.

Referring to FIG. 2B, the first capping layer 123 may be formed to cover the interlayer dielectric layer 110 and then the first intermetal dielectric layer 161 may be formed on the first capping layer 123. In example embodiments, the first capping layer 123 may have a non-uniform thickness. For example, the first capping layer 123 may have a relatively smaller thickness on the through electrode 140.

Referring to FIG. 2C, a semiconductor device 2 may be fabricated through processes identical or similar to those discussed with reference to FIGS. 1I to 1L but with the aforementioned modifications of FIGS. 2A and 2B.

As shown in FIG. 2D, the region A between adjacent first metal lines 151 may have no interface that can cause an electrical failure of the semiconductor device 2. The through electrode 140 may have the top surface 140s higher than the top surface 104s of electrical the contact 104.

According to example embodiments, as discussed in FIG. 2B, the first capping layer 123 may have a non-uniform thickness. For example, the first capping layer 123 may have a first thickness T1 between the second interconnection lines 154 on the through electrode 140 and a second thickness T2, greater than the first thickness T1, at other portions thereof. As the first capping layer 123 has the non-uniform thickness, the top surface 140s of the through electrode may be non-flat. For example, the top surface 140s of the through electrode 140 may have a portion that protrudes from the top surface 151s of the first metal line 151 along a direction away from the active surface 100a of the substrate 100.

Figure 3A:
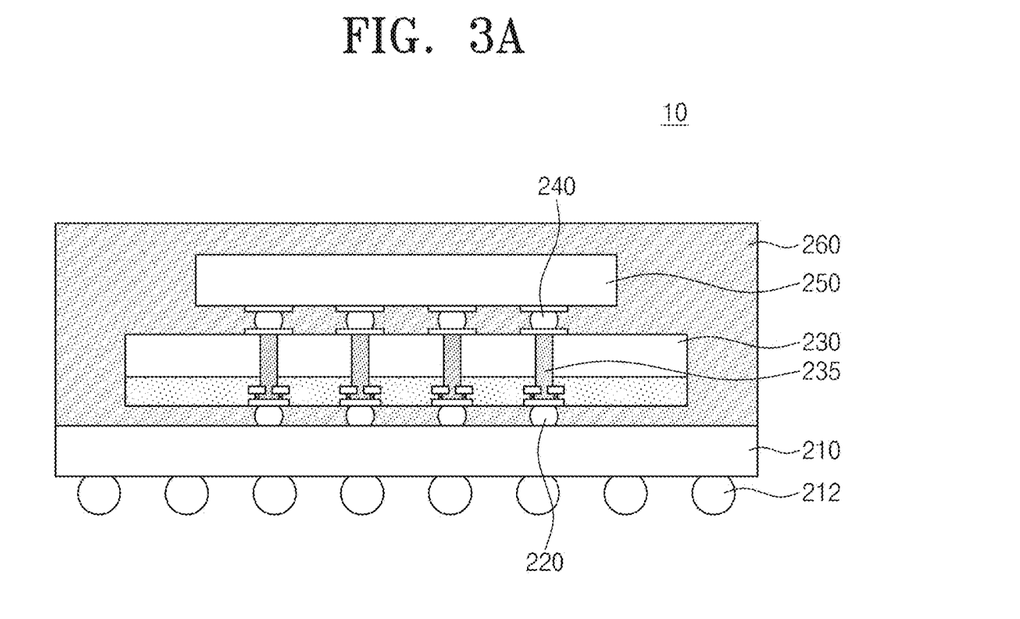
FIG. 3A is a cross-sectional view illustrating a semiconductor package including a semiconductor device according to example embodiments of the present inventive concepts.
Figure 3B:
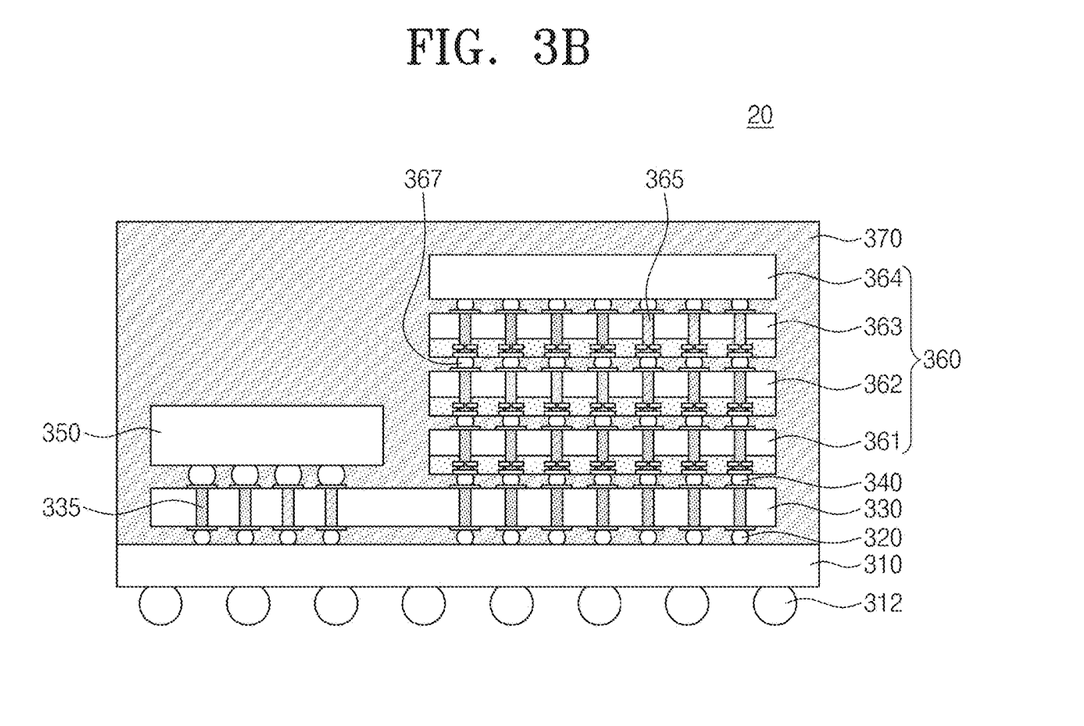
FIG. 3B is a cross-sectional view illustrating a semiconductor module including a semiconductor device according to example embodiments of the present inventive concepts.

FIG. 3A is a cross-sectional view illustrating a semiconductor package including a semiconductor device according to example embodiments of the present inventive concepts. FIG. 3B is a cross-sectional view illustrating a semiconductor module including a semiconductor device according to example embodiments of the present inventive concepts.

Referring to FIG. 3A, a semiconductor package 10 may include a package substrate 210 (e.g., a printed circuit board) having outer terminals 212 attached thereto, an application processor 230 mounted on the package substrate 210, a memory chip 250 stacked on the application processor 230, and a mold layer 260 covering the application processor 230 and the memory chip 250. The semiconductor package 10 may be used a part of mobile products such as a cellular phone or a tablet computer.

The application processor 230 may be electrically connected to the package substrate 210 through a solder ball 220 disposed on the package substrate 210. The memory chip 250 may be electrically connected to the application processor 230 through a solder ball 240 disposed on the application processor 230. The application processor 230 may be mounted on the package substrate 210 in such a way that an active surface thereof faces the package substrate 210 or the memory chip 250. The memory chip 250 may be stacked on the application processor 230 in such a way that an active surface thereof faces the application processor 230. The application processor 230 may include a through electrode 235. For example, the application processor 230 may be configured to have a structure substantially identical or similar to that of the semiconductor device 1 of FIG. 1L or the semiconductor device 2 of FIG. 2C. The description of the semiconductor device 1 of FIG. 1L or the semiconductor device 2 of FIG. 2C may also be applicable to the application processor 230.

Referring to FIG. 3B, a semiconductor module 20 may be a memory module including a package substrate 310 (e.g., a printed circuit board) having outer terminals 312 attached thereto, a chip stack 360 and a graphic processing unit (GPU) 350 mounted on the package substrate 310, and a mold layer 370 covering the chip stack 360 and the graphic processing unit 350. The semiconductor module 20 may further include an interposer 330 provided on the package substrate 310.

The graphic processing unit 350 and the chip stack 360 may be electrically connected to the interposer 330 through solder balls 340. The interposer 330 may include a through electrode 335 and be electrically connected to the package substrate 310 through a solder ball 320 disposed on the package substrate 310.

The chip stack 360 may include a plurality of high-band memory chips 361, 362, 363 and 364 that are sequentially stacked. The memory chips 361-364 may be electrically connected to each other through solder balls 367. At least one of the memory chips 361-364 may include one or more through electrodes 365. For example, each of the first, second, and third memory chips 361-363 may include at least one through electrode 365. The through electrode may not be provided in the fourth memory chip 364. Alternatively, the fourth memory chip 364 may include the through electrode 365. At least the first to third ones 361-363 of the memory chips 361-364 may be configured to respectively have structures substantially identical or similar to that of the first semiconductor device 1 of FIG. 1L or the semiconductor device 2 of FIG. 2C. The description of the semiconductor device 1 of FIG. 1L or the semiconductor device 2 of FIG. 2C may also be applicable to the first to third memory chips 361-363.

According to example embodiments of the present inventive concepts, as the metal lines are configured to have no interface therebetween along which constituents of the metal lines are moved, an electrical short may be prevented between the metal lines. It therefore may be possible for the semiconductor device to obtain improved electrical characteristics.

Although some example embodiments have been described and illustrated in the accompanying drawings, example embodiments are not limited thereto. It will be apparent to those skilled in the art that various substitution, modifications and changes may be thereto without departing from the scope and spirit of the example embodiments.

What is claimed is:
1. A semiconductor device comprising:
a substrate including an integrated circuit;
an interlayer dielectric layer covering the integrated circuit on the substrate;
first metal lines provided in the interlayer dielectric layer and on the integrated circuit, the first metal lines electrically connected to the integrated circuit;
a through electrode penetrating the substrate and the interlayer dielectric layer; and
a first capping layer covering the interlayer dielectric layer, the first metal lines, and the through electrode, wherein the first capping layer comprises:
a first portion on the through electrode; and
a second portion on the first metal lines,
wherein a thickness of the first portion and a thickness of the second portion are different each other, and wherein the first metal lines contact a lower surface of the first capping layer.

2. The semiconductor device of claim 1, wherein the thickness of the first portion is smaller than the thickness of the second portion.

3. The semiconductor device of claim 1, wherein an uppermost portion of the through electrode provided on a higher level than an upper surface of the first metal lines and an upper surface of the interlayer dielectric layer.

4. The semiconductor device of claim 1, further comprises:
an intermetal dielectric layer on the first capping layer; and
second metal lines and third metal lines provided in the intermetal dielectric layer, the second metal lines electrically connected to the first metal lines and the third metal lines electrically connected to the through electrode.

5. The semiconductor device of claim 4, wherein an upper surface of the second metal lines provided on a same level with an upper surface of the third metal lines.

6. The semiconductor device of claim 4, wherein a width of a bottom surface of the second metal lines is smaller than a width of a bottom surface of the third metal lines.

7. The semiconductor device of claim 4, wherein a width of the first metal lines are greater than a width of a bottom surface of the second metal lines.

8. The semiconductor device of claim 4, further comprising:
a second capping layer covers the intermetal dielectric layer and the second metal lines;
an upper protection layer on the third metal lines;
an upper line penetrating the upper protection layer and electrically connected to the second metal lines; and
an upper terminal on the upper line.

9. The semiconductor device of claim 1, wherein a top surface of the first metal lines are coplanar with a top surface of the interlayer dielectric layer.

10. The semiconductor device of claim 1, further comprises:
an electrical contact penetrating the interlayer dielectric layer from the substrate and contacts a lower surface of the first metal lines, and
wherein a width of the first metal lines are greater than a width of the electrical contact.

11. The semiconductor device of claim 1, wherein the first capping layer comprises SiN or SiCN.

12. The semiconductor device of claim 1, wherein the through electrode comprises:
a conductive layer;
a via insulation layer covering a side surface of the conductive layer; and
a barrier layer between the conductive layer and the via insulation layer.

13. A semiconductor device comprising:
a substrate including an integrated circuit;
an interlayer dielectric layer covering the integrated circuit on the substrate;
first metal lines provided in the interlayer dielectric layer and on the integrated circuit, the first metal lines electrically connected to the integrated circuit through an electrical contact;
a through electrode penetrating the substrate and the interlayer dielectric layer; and
a capping layer covering the interlayer dielectric layer, the first metal lines, and the through electrode,
wherein the capping layer has non-uniform thicknesses, wherein the first metal lines contact a lower surface of the capping layer.

14. The semiconductor device of claim 13, wherein the capping layer comprises:
a first portion on the through electrode; and
a second portion on the first metal lines, and
wherein a thickness of the first portion is smaller than a thickness of the second portion.

15. The semiconductor device of claim 13, wherein an uppermost portion of the through electrode provided on a higher level than an upper surface of the first metal lines and an upper surface of the interlayer dielectric layer.

16. The semiconductor device of claim 13, further comprises:
an intermetal dielectric layer on the capping layer; and
second metal lines and third metal lines provided in the intermetal dielectric layer, the second metal lines electrically connected to the first metal lines and the third metal lines electrically connected to the through electrode.

17. The semiconductor device of claim 16, wherein an upper surface of the second metal lines provided on a same level with an upper surface of the third metal lines.

18. The semiconductor device of claim 16, wherein a width of the first metal lines are greater than a width of a bottom surface of the second metal lines.

19. The semiconductor device of claim 13, wherein a top surface of the first metal lines are coplanar with a top surface of the interlayer dielectric layer.

20. The semiconductor device of claim 13, further comprises an electrical contact penetrating the interlayer dielectric layer from the substrate and contacts a lower surface of the first metal lines, and
wherein a width of the first metal lines are greater than a width of the electrical contact.

21. A semiconductor device comprising:
a substrate including an integrated circuit;
an interlayer dielectric layer covering the integrated circuit on the substrate;
first metal lines provided in the interlayer dielectric layer and on the integrated circuit, the first metal lines electrically connected to the integrated circuit through an electrical contact;
a through electrode penetrating the substrate and the interlayer dielectric layer;
a capping layer covering the interlayer dielectric layer, the first metal lines, and the through electrode;
a intermetal dielectric layer on the capping layer; and
second metal lines and third metal lines provided in the intermetal dielectric layer, the second metal lines electrically connected to the first metal lines and the third metal lines electrically connected to the through electrode,
wherein the first metal lines contact a lower surface of the capping layer,
wherein an upper surface of the first metal lines provided on a lower level than an uppermost portion of the through electrode, and
wherein an upper surface of the second metal lines provided on a same level with an upper surface of the third metal lines.

22. The semiconductor device of claim 21, wherein the capping layer comprises:
a first portion on the through electrode; and
a second portion on the first metal lines, and
wherein a thickness of the first portion is smaller than a thickness of the second portion.

23. The semiconductor device of claim 21, wherein an uppermost portion of the through electrode provided on a higher level than an upper surface of the first metal lines and an upper surface of the interlayer dielectric layer.

24. The semiconductor device of claim 21, wherein a width of the first metal lines are greater than a width of a bottom surface of the second metal lines.

25. The semiconductor device of claim 21, further comprises:
- an electrical contact penetrating the interlayer dielectric layer from the substrate and contacts a lower surface of the first metal lines, and
- wherein a width of the first metal lines are greater than a width of the electrical contact.

26. The semiconductor device of claim 21, further comprising:
- a first terminal on the intermetal dielectric layer and being electrically connected to the third metal lines;
- a second terminal on a bottom surface of the substrate and being electrically contacted with the through electrode;
- a package substrate disposed on the intermetal dielectric layer and electrically connected to the third metal lines through the first terminal; and
- a memory chip disposed on the substrate and mounted on the second terminal,
- wherein the integrated circuit include an application processor.

27. The semiconductor device of claim 21, further comprising:
- a first terminal on the intermetal dielectric layer and being electrically connected to the third metal lines;
- a second terminal on a bottom surface of the substrate and being electrically contacted with the through electrode;
- a interposer disposed on the intermetal dielectric layer and electrically connected to the third metal lines through the first terminal;
- memory chips stacked each other, a lower memory chip of the memory chips is mounted on the second terminal; and
- a graphics processing unit mounted on the interposer and spaced apart from the memory chips.

* * * * *